(12) United States Patent
Goel

(10) Patent No.: US 7,380,181 B2
(45) Date of Patent: May 27, 2008

(54) TEST CIRCUIT AND METHOD FOR HIERARCHICAL CORE

(75) Inventor: Sandeep K. Goel, Eindhoven (NL)

(73) Assignee: NXP B.V., Eindhoven (NL)

( * ) Notice: Subject to any disclaimer, the term of this patent is extended or adjusted under 35 U.S.C. 154(b) by 150 days.

(21) Appl. No.: 10/591,191

(22) PCT Filed: Feb. 22, 2005

(86) PCT No.: PCT/IB2005/050645

§ 371 (c)(1),
(2), (4) Date: Aug. 30, 2006

(87) PCT Pub. No.: WO2005/088325

PCT Pub. Date: Sep. 22, 2005

(65) Prior Publication Data

US 2007/0208971 A1    Sep. 6, 2007

(30) Foreign Application Priority Data

Mar. 1, 2004    (EP)    ................................. 04100812

(51) Int. Cl.
*G01R 31/28*    (2006.01)

(52) U.S. Cl. ........................................ 714/724; 714/30

(58) Field of Classification Search ................ 714/726, 714/727, 729, 733, 724, 30
See application file for complete search history.

(56) References Cited

U.S. PATENT DOCUMENTS

| | | | |
|---|---|---|---|
| 5,889,788 A * | 3/1999 | Pressly et al. | 714/726 |
| 6,587,981 B1 * | 7/2003 | Muradali et al. | 714/726 |
| 7,085,978 B2 * | 8/2006 | McLaurin et al. | 714/726 |
| 7,308,631 B2 * | 12/2007 | McLaurin | 714/726 |
| 2002/0184583 A1 | 12/2002 | Kiyoshi et al. | |
| 2003/0191996 A1 * | 10/2003 | Mukherjee et al. | 714/724 |

* cited by examiner

*Primary Examiner*—David Ton
(74) *Attorney, Agent, or Firm*—Peter Zawilski

(57) ABSTRACT

A wrapper architecture has a parent core A and a child core B. The parent core A comprises scan chains (70), wrapper input cells (71), wrapper output cells (74) and a parent TAM, PTAM [0:2]. Likewise, the child core comprises scan chains (76), wrapper input cells (75) and wrapper output cells (72), and is connected to a child TAM, CTAM [0:2]. Each wrapper input cell (75) and each wrapper output cell (72) of the child core is adapted to be connected to the parent TAM, PTAM, in addition to being connected to the child TAM, CTAM, thereby enabling the child core to be placed in the In-test and Ex-test modes at the same time, and allowing the parent and child cores to be tested in parallel.

39 Claims, 16 Drawing Sheets

Wrapper input cell

Wrapper input cell

Wrapper output cell

TEST CIRCUIT AND METHOD FOR HIERARCHICAL CORE

The present invention relates to a test circuit and method, and in particular, to a test circuit and method for testing system chips with one or more hierarchical cores.

To minimize design time, re-usable cores are increasingly being utilized for the design of large and complex system chips (SOCs). Cores are pre-designed and pre-verified design modules, which are often supplied by different companies. Examples of such cores are embedded memories, analog blocks, CPUs, DSPs and user-defined logic blocks.

The testing of core-based SOCs is best done in a core-based fashion. Usually, cores are deeply embedded in the SOC and not all cores are directly accessible from chip pins. Therefore, a typical core-based test infrastructure consists of (1) a test access mechanism (TAM) that allows access to the core-under-test from the SOC pins, and (2) a core test wrapper that allows the isolation of the core that is required to apply the tests.

The wrapper and TAM are sometimes referred to as TestShell and TestRail. Standardized but scalable wrapper architectures are known. However they do not standardize the TAM design and optimization, as it depends on many SOC-specific parameters. As there is a limited number of chip pins at the SOC boundary, one cannot afford to provide a separate TAM of sufficient width (wires) to every core in the SOC. Therefore, in practice, multiple cores share a common TAM. This constitutes a problem for test architecture design. To design a test architecture for a given SOC with a given number of test pins, one needs to determine the following:

Number of individual TAMs and their widths such that the total number of pins used by the TAMs is less than or equal to the given number of test pins, The assignment of cores to TAMs, and Wrapper design for each core.

The design of wrappers and TAMs have a large impact on the SOC test time, since every SOC test architecture has a corresponding optimum test schedule. Tools have been developed to assist in designing a complete test architecture consisting of wrappers and TAMs for a given SOC, such that the SOC test time is minimized.

However, all existing methods available for wrapper and TAM design assume one level of hierarchy (SOC and cores) in a SOC, whereby the SOC design consists of multiple levels of cores in the design. Hierarchy arises, for example, when an in-house designed core contains one or more in-house/external cores. As a result, modern SOC designs are not limited to only one level of hierarchy (SOC and cores), but instead consist of multiple levels of hierarchy.

Thus, since existing methods available for wrapper and TAM design assume no hierarchy in a SOC, all cores in the SOC are treated at the same level, even if there is a hierarchy among the cores. Due to this, optimum test schedules proposed by these methods allow testing of parent and child cores in parallel, which is not possible with their current wrapper architectures. Current wrapper architectures support at-least three modes: (1) Normal mode, (2) Inward-facing (In-test) mode, and (3) Outward-facing (Ex-test) mode. Existing wrappers can only be configured in one mode at a time. The testing of a parent core requires its wrapper to be configured in the "In-test" mode and the wrappers of its child core to be configured in the "Ex-test" mode. Hence, during the testing of a parent core, both TAMs, the one connected to the parent core itself and the one that is connected to the child core are used for testing the parent core. Therefore, solutions proposed by the known methods are not directly applicable in the real-life SOCs. To prevent testing of the parent and child cores in parallel, the test schedules can be modified in such a way that only one of the two is tested at a time. Unfortunately, this leads to serialization of various tests and hence severely affects the SOC test time.

Therefore, the aim of the present invention is overcome the disadvantages mentioned above, and to provide a test wrapper architecture and method for testing SOCs with one or more hierarchical cores, which enables test schedules to be optimized, so that a minimum SOC test time can be obtained.

According to a first aspect of the invention there is provided a test wrapper architecture for testing an electronic circuit having one or more hierarchical cores. The test wrapper architecture comprises: a first core having a wrapper input cell and a wrapper output cell, the wrapper input cell and wrapper output cell being configured to receive a primary input signal and a test input signal for the first core, and to output a primary output signal and a test output signal for the first core; a second core having a wrapper input cell and a wrapper output cell, the wrapper input cell and wrapper output cell being configured to receive a primary input signal (PI) and a test input signal (CTI) for the second core, and to output a primary output signal (PO) and a test output signal (CTI) for the second core; wherein the wrapper input cell and the wrapper output cell of the second core are further adapted to receive a test input signal (PTI) from the first core, and to output a test output signal (PTO) to the first core, thereby enabling the first core and the second core to be tested in parallel.

According to another aspect of the invention, there is provided a wrapper cell for a test architecture used for testing an electronic circuit having one or more hierarchical cores, the wrapper cell comprising: a first input (PI) for receiving a primary data signal; a second input (CTI) for receiving a test data signal; a first output (PO) for outputting a primary data signal; a second output (CTO) for outputting a test data signal; wherein the wrapper cell further comprises a third input (PTI) for receiving a test input signal from another core, and a third output (PTO) for outputting a test output signal to the other core.

According to a further aspect of the invention there is provided a method of testing an electronic circuit having one or more hierarchical cores, the method comprising the steps of:

in a first core having a wrapper input cell and a wrapper output cell, configuring the wrapper input cell and wrapper output cell to receive a primary input signal and a test input signal for the first core, and to output a primary output signal and a test output signal for the first core;

in a second core having a wrapper input cell and a wrapper output cell, configuring the wrapper input cell and wrapper output cell to receive a primary input signal (PI) and a test input signal (CTI) for the second core, and to output a primary output signal (PO) and a test output signal (CTI) for the second core; and configuring the wrapper input cell and the wrapper output cell of the second core to receive a test input signal (PTI) from the first core, and to output a test output signal (PTO) to the first core, thereby enabling the first core and the second core to be tested in parallel.

According to a further aspect of the invention, there is provided an integrated circuit comprising a test wrapper architecture or a wrapper cell as defined in the claims.

According to a further aspect of the invention, there is provided an automatic test equipment comprising means for operating a test wrapper architecture or a wrapper cell as defined in the claims.

The invention has the advantage of enabling hierarchical cores to be tested in parallel, while minimizing the SOC test time.

For a better understanding of the invention, and to show more clearly how it may be carried into effect, reference will now be made, by way of example only, to the following drawings in which.

Figure 1:
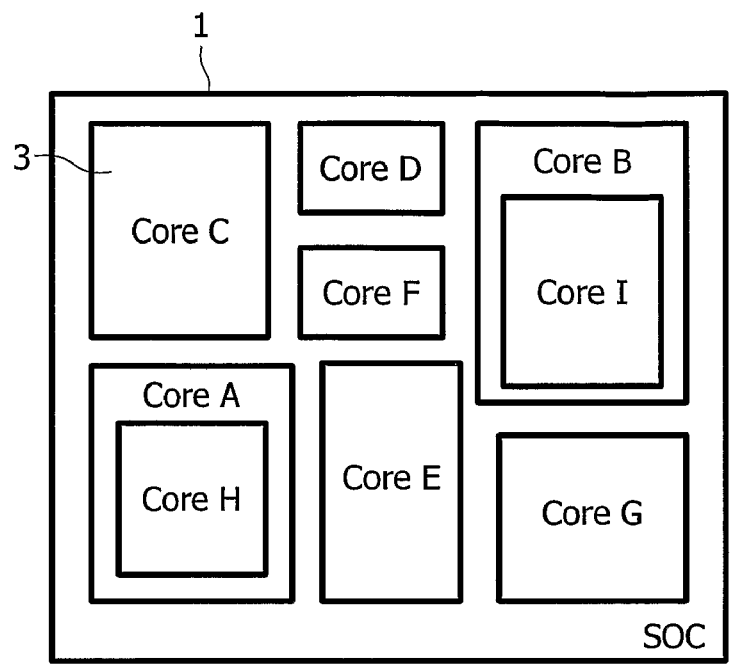
FIG. 1 shows a typical SOC having hierarchical cores.

FIG. 1 shows a typical SOC 1 comprising a number of cores 3. For illustration purposes the SOC is shown as having nine cores A to I, out of which Cores A and Core B are hierarchical cores. Core A contains a child core, Core H, while Core B contains a child core, Core I.

Figure 2:
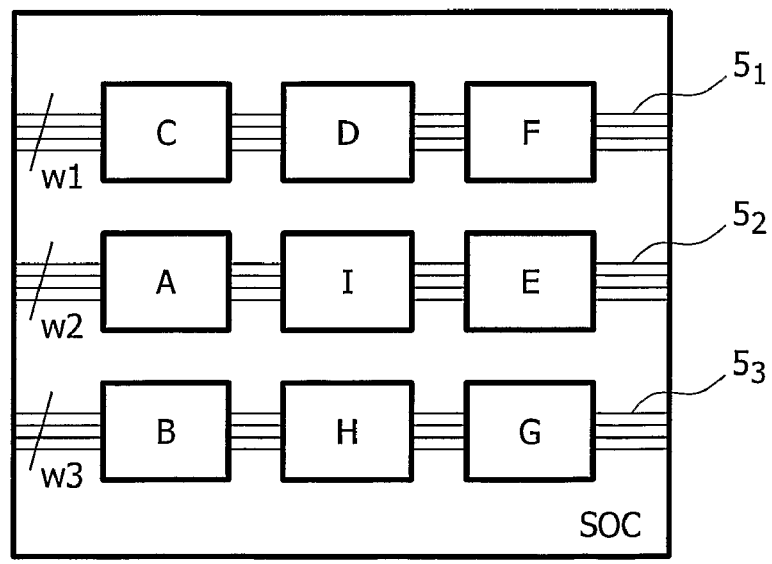
FIG. 2 shows a typical test architecture for testing the SOC of FIG. 1.

FIG. 2 shows an example test architecture for the SOC shown in FIG. 1, and contains three TAMs $5_1$ to $5_3$ having widths w1, w2, and w3, respectively. The first TAM $5_1$ is used to test cores C, D and F, the second TAM $5_2$ used to test cores A, I and E, while the third TAM $5_3$ is used to test cores B, H and G.

Figure 3:
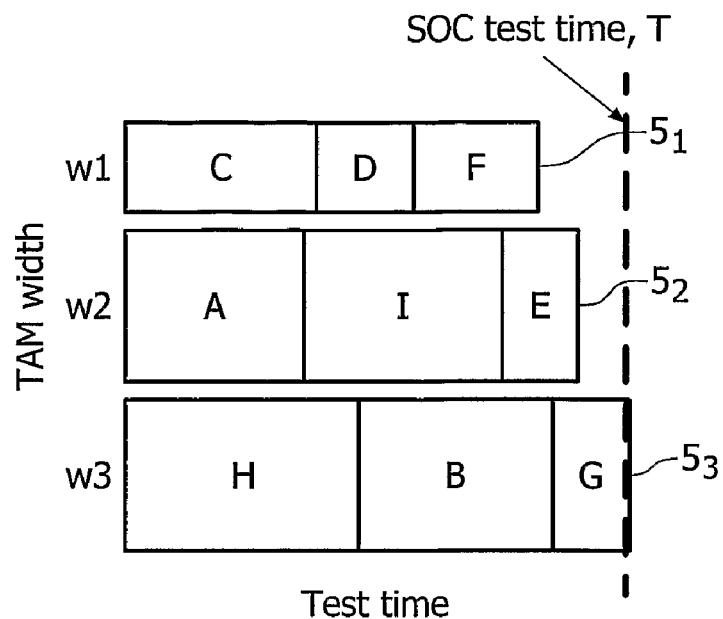
FIG. 3 shows an example test schedule for the SOC of FIG. 1 assuming no hierarchy among the cores.

FIG. 3 shows the optimal test schedule for the test architecture shown in FIG. 2, on the assumption that no hierarchy exists, i.e. a flat core structure. The horizontal axis shows the test time, while the vertical axis shows the TAM width. Since all TAMs $5_1$ to $5_3$ in the architecture are assumed to be tested in parallel, the total test time for the SOC is determined by the test time of the TAM having the longest test time, i.e. time "T" corresponding to the test time for TAM $5_3$ in the example. It is noted that the test time shown in FIG. 3 is the time required to test the circuitry inside the core (i.e. its wrapper in the In-test mode). Thus, it can be seen from FIG. 3 that, if in reality all cores are at the same level, an efficient test completion time can be obtained. However, as shown in FIG. 1, core A and core B contain core H and core I, respectively, which means that the cores A and H, and cores B and I cannot in fact be tested in parallel as shown in FIG. 3. Therefore, the test schedule shown in FIG. 3 is no longer valid.

Figure 4:
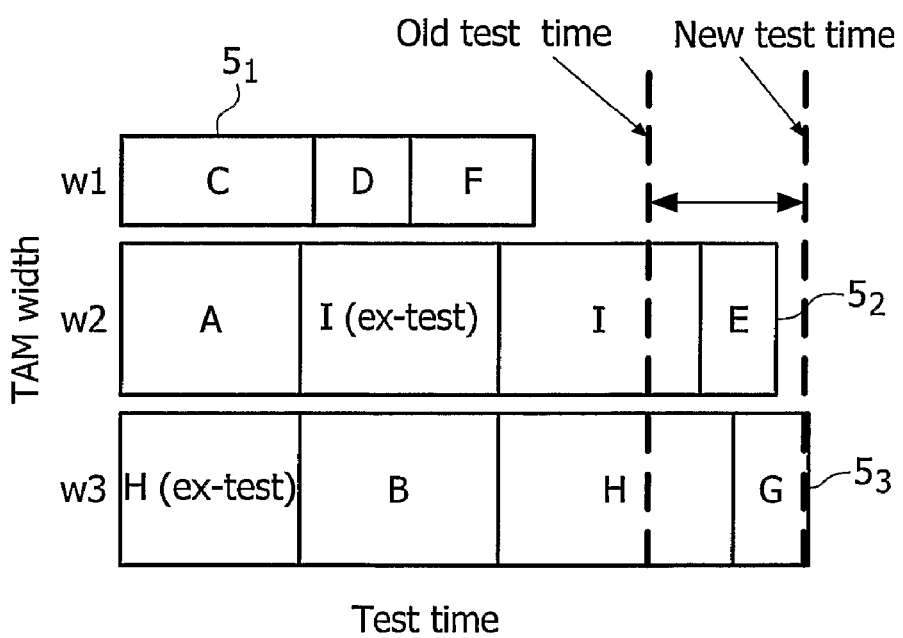
FIG. 4 shows a modified test schedule for the SOC of FIG. 1 assuming hierarchical cores.

FIG. 4 shows a modified test schedule considering the hierarchical nature of cores A and B. When parent core A is being test (i.e. in the In-test mode), the child core H is placed in the Ex-test mode. Similarly, when the parent core B is being tested, the child core I is placed in the Ex-test mode. Since the child cores H and I need to be placed in the Ex-test mode when testing the parent cores A and B, this means that the child cores H and I cannot be placed in the In-test mode, and hence cannot be tested in parallel with the parent cores A and B. In other words, the parent and child cores cannot be tested in parallel due to the fact that the wrappers only allow one test mode at a time, which results in a modified test schedule which is substantially longer than the original test time.

Figure 5:
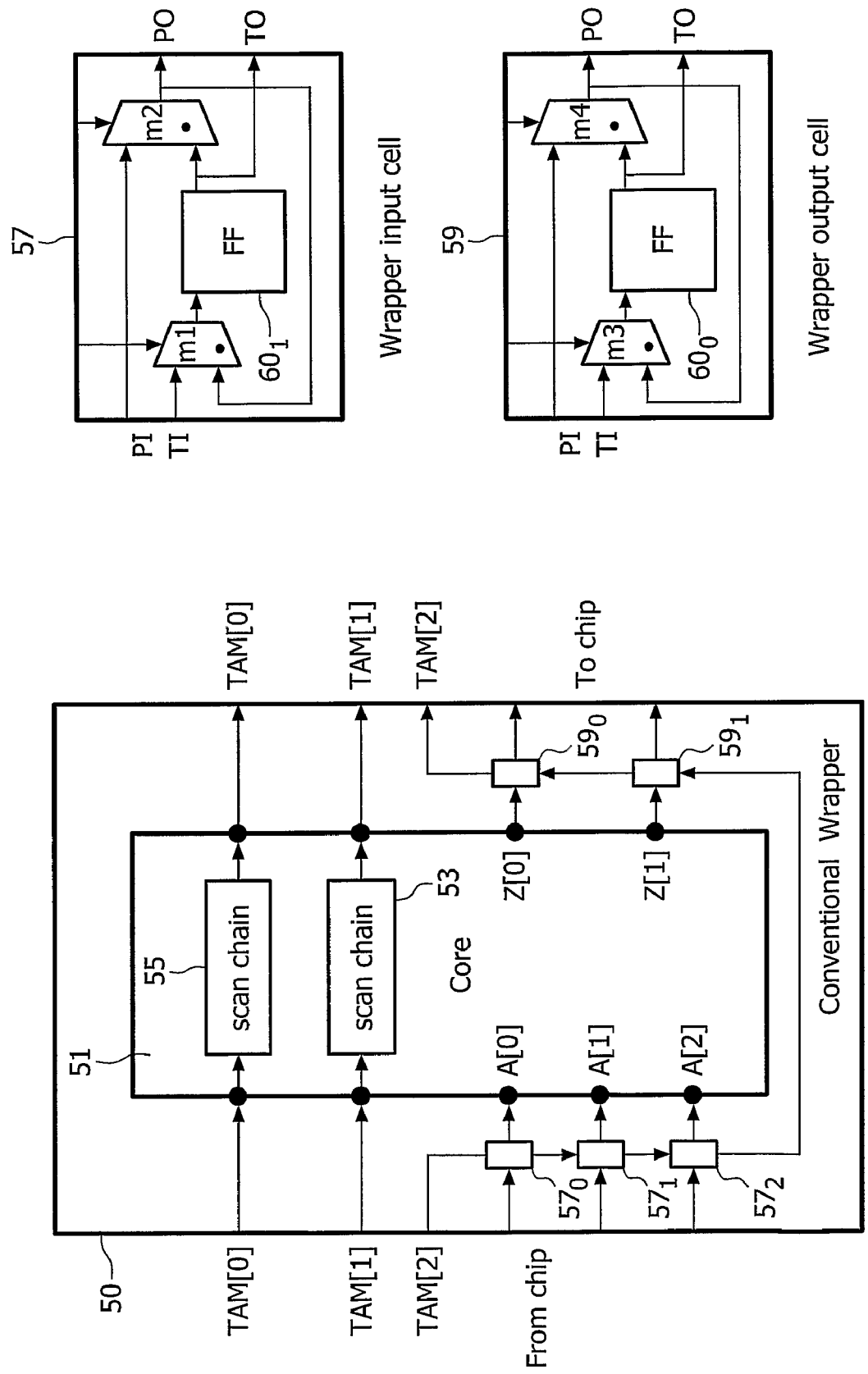
FIG. 5 shows a conventional wrapper architecture with its wrapper input and output cells.

FIG. 5, shows a conventional wrapper architecture 50 for an example core 51 with two scan chains 53, 55, three functional input terminals A [0:2], and two functional output terminals Z [0:1]. In addition to the parallel ports shown in FIG. 5, it is noted that the wrapper 50 may comprise control circuitry and connections through a one-bit serial port, but these have been omitted for clarity.

The core 51 is connected to a three bit-wide TAM called TAM [0:2]. In the wrapper architecture, each functional input terminal A[0:2] is connected to a wrapper input cell $57_0$, $57_1$, $57_2$, respectively, while each functional output terminal Z[0:1] is connected to a wrapper output cell $59_0$, $59_1$, respectively.

Each wrapper input cell 57 comprises first and second multiplexers, m1, m2 and a memory element, for example a flip-flop $60_i$, while each wrapper output cell comprises first and second multiplexers m3, m4 and a memory element, such as a flip-flop $60_o$.

Table 1 shows the multiplexer settings for the various modes supported by the wrapper architecture. As scan tests consist of two phases, i.e., the shift and normal phases, the table lists the settings for these phases separately.

TABLE 1

| Wrapper Mode | Wrapper Input Cell | | Wrapper Output Cell | |
| --- | --- | --- | --- | --- |
| | m1 | m2 | m3 | m4 |
| Functional | X | 1 | X | 1 |
| In-test shift | 1 | X | 1 | X |
| In-test normal | X | 0 | 0 | 1 |
| Ex test shift | 1 | X | 1 | X |
| Ex test normal | 0 | 1 | X | 0 |

In the functional mode, a wrapper input cell is in the transparent mode and the core is connected to its surrounding through its functional terminals A[0:2] and Z[0:1]. In other words, the wrapper input cell has the multiplexer m2 selected, such that an input signal PI from the chip is passed to the output PO for the core. Likewise, in the functional mode, the wrapper output cell is configured such that multiplexer m4 is selected, thus causing the input signal PI from the core to be passed to the output PO for the chip.

The In-test mode is used to test the circuitry inside the core itself. Therefore, the wrapper cells are configured in such a way, that test stimuli can be applied at the input terminals of the core and test responses observed from the output terminals of the core. The Ex-test mode is used to test the circuitry outside the core, i.e., the logic and interconnects between the cores. In this mode, the input terminals of a core are configured in such a way that they can be used to capture the test responses from the circuitry behind the input terminals of the core. Similarly, the output terminals are configured in such a way that they can be used to apply test stimuli to the circuitry in front of the output terminals of the core.

From Table 1, it can be seen that a wrapper input/output cell can only be used either to apply or to capture data, but not carry out both aspects at the same time. Therefore, the wrapper architecture according to the prior art does not allow testing of a parent and child core in parallel, since testing of a parent core requires a child core to be in Ex-test mode, while testing of the child core requires the wrapper cell to be in the In-test mode. This is because the testing of a parent core, apart from accessing its own elements, must also capture responses in the wrapper input cells and apply test stimuli to the wrapper output cells of its child core.

Figure 6:
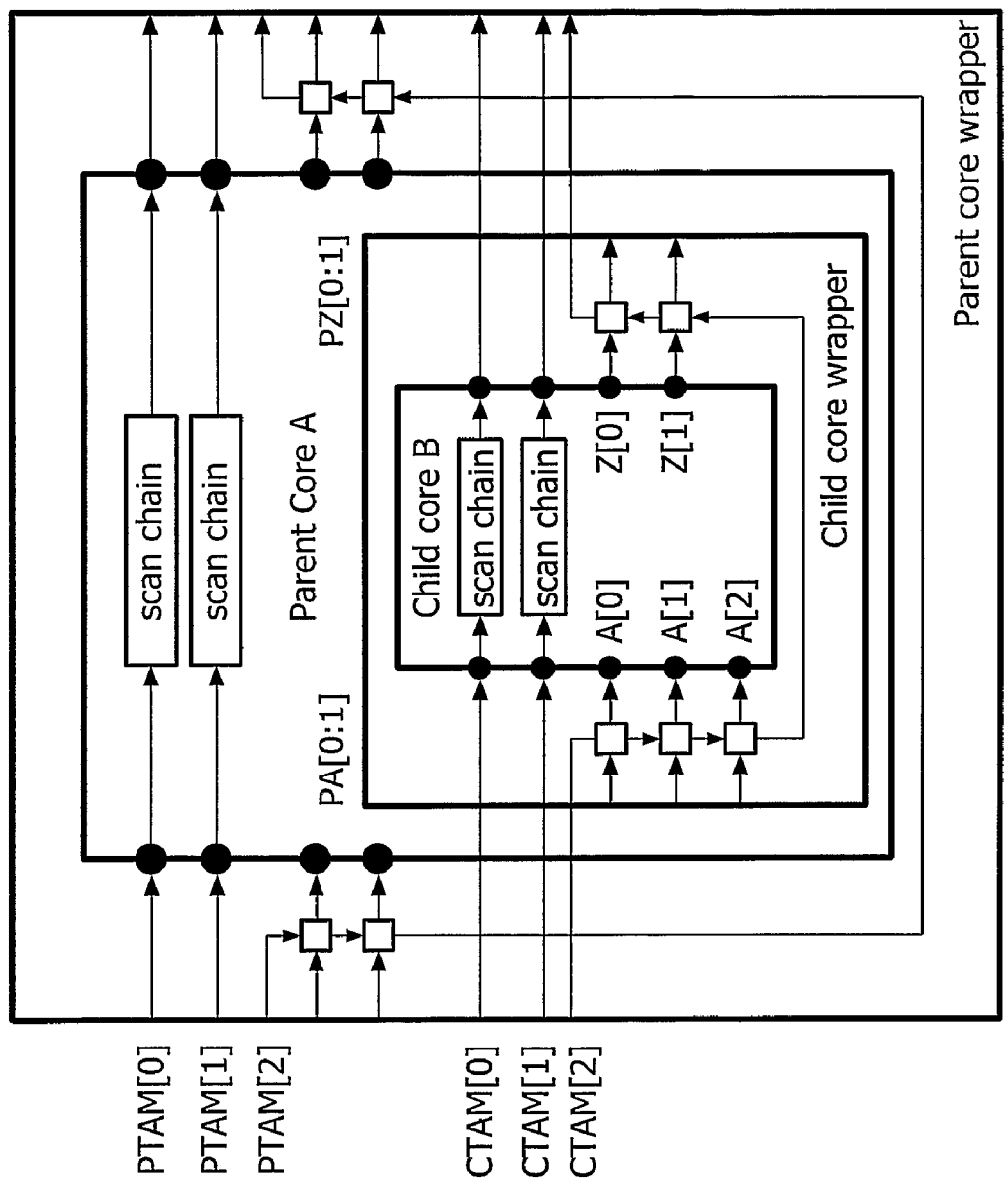
FIG. 6 shows a wrapper having hierarchical cores.

To further understand why the parent and child cores cannot be tested in parallel with a conventional wrapper design, reference will now be made to FIGS. 6 to 10. FIG. 6 shows a parent core A together with its child core B. The TAM connected to the parent core A is referred to as PTAM [0:2], while the TAM connected to the child core is referred as CTAM [0:2].

Figure 7:
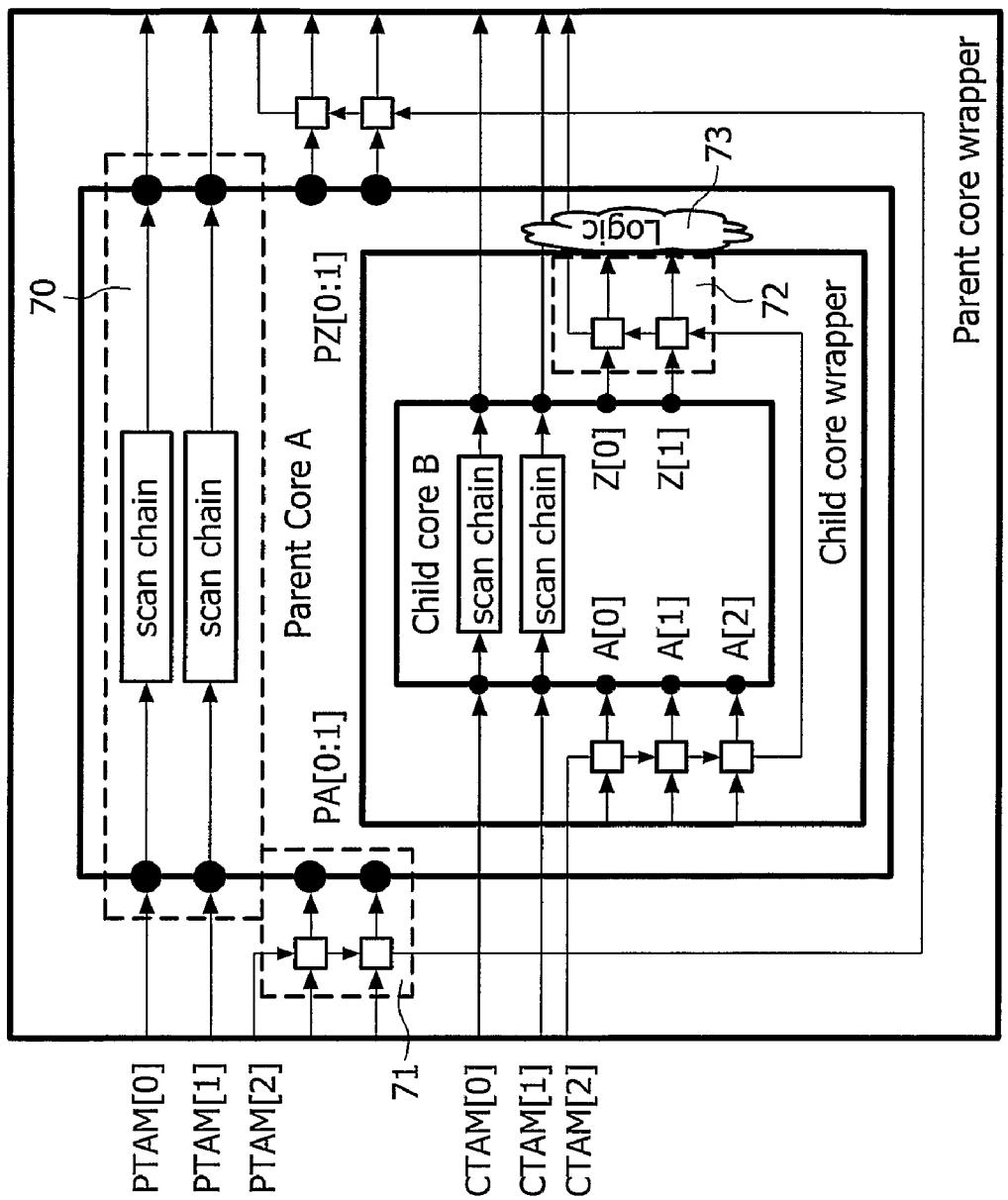
FIG. 7 illustrates the testing of the parent core of FIG. 6, and how test stimuli are applied to the core.

Referring to FIG. 7, the components used to test the parent core A are shown in boundary boxes, 70, 71 and 72. In order to test the parent core A in the In-test mode, test stimuli need to be applied to the scan chains 70 of the parent core, and to its wrapper input cells 71 (marked as PA[0:1]). In addition, test stimuli need to be applied to the output wrapper cells 72 of the child core B (marked as Z[0:1]), this being required in order to test the circuitry after the child wrapper output cells 72 of the child core B (the circuitry being shown as logic cloud 73).

Figure 8:
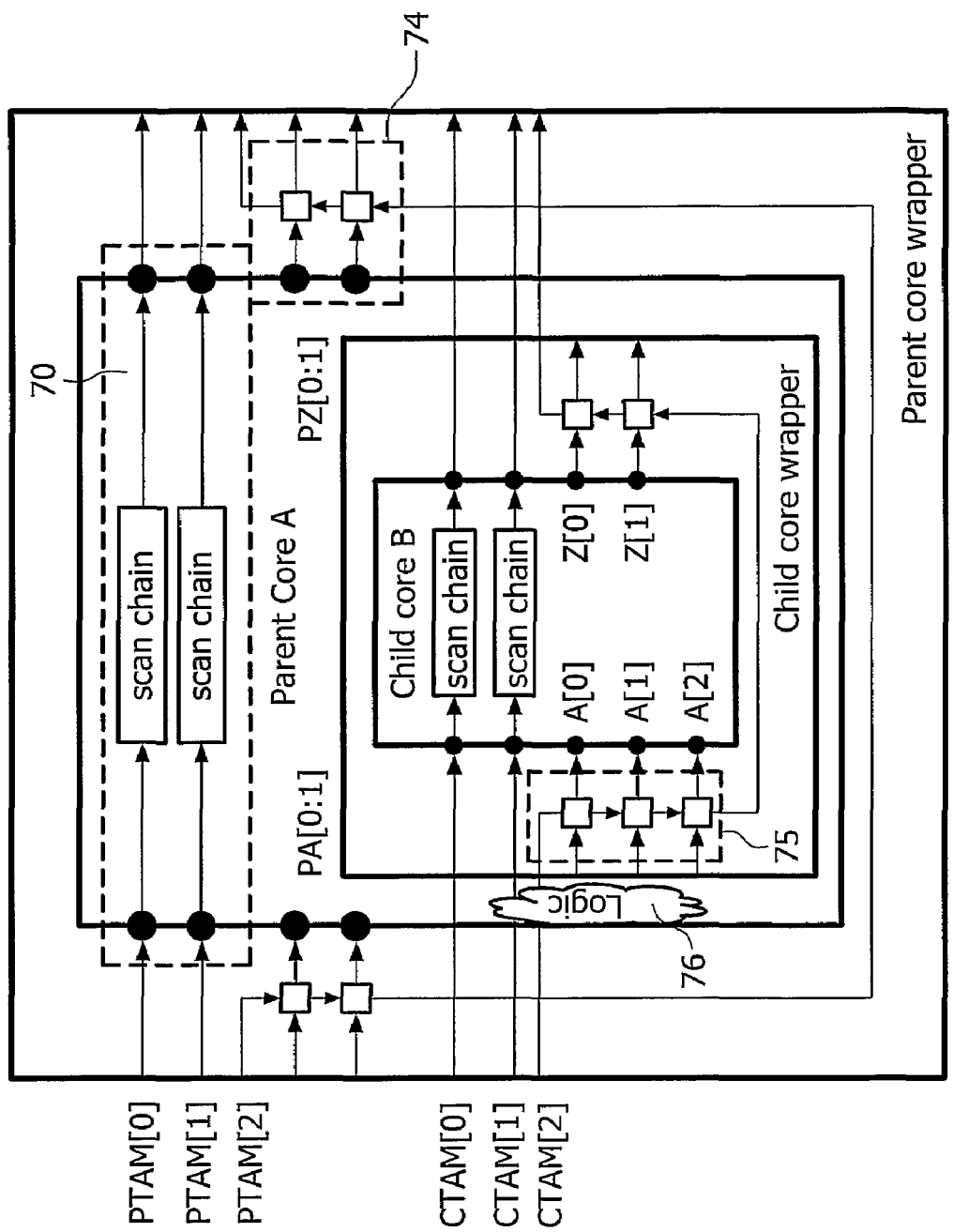
FIG. 8 shows the testing of the parent core of FIG. 6, and how the test responses are observed.

Similarly, referring to FIG. 8, the test responses from the scan chains 70 of the parent core A need to be observed, via the wrapper out cells 74 of the parent core A (marked as PZ[0:1]). In addition, the test responses from the circuitry before the child wrapper input cells 75 need to be observed (the circuitry being shown as logic cloud 76), the child wrapper input cells marked as A[0:2].

Figure 9:
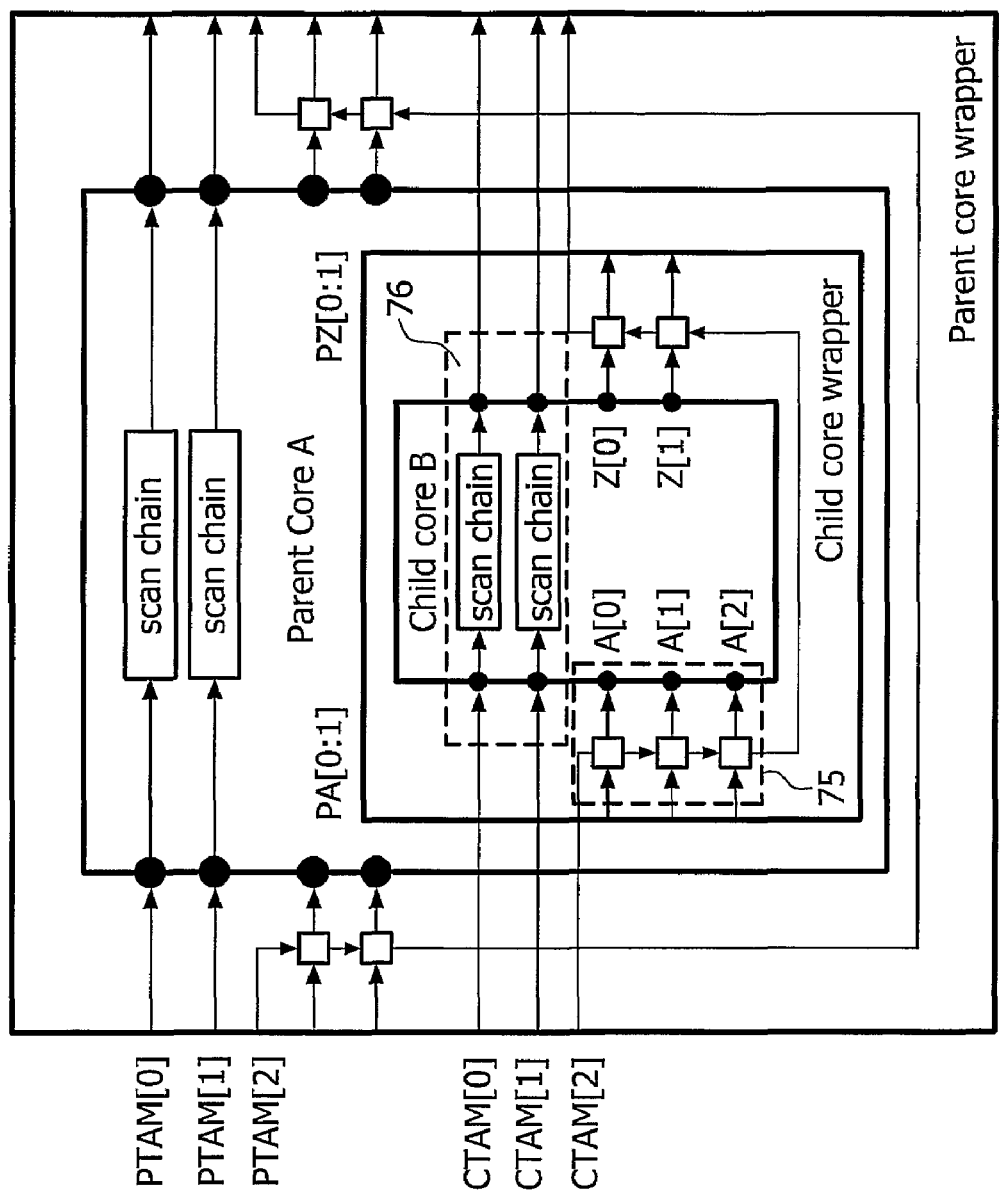
FIG. 9 shows the testing of the child core of FIG. 6, and how test stimuli are applied to its scan chains.
Figure 10:
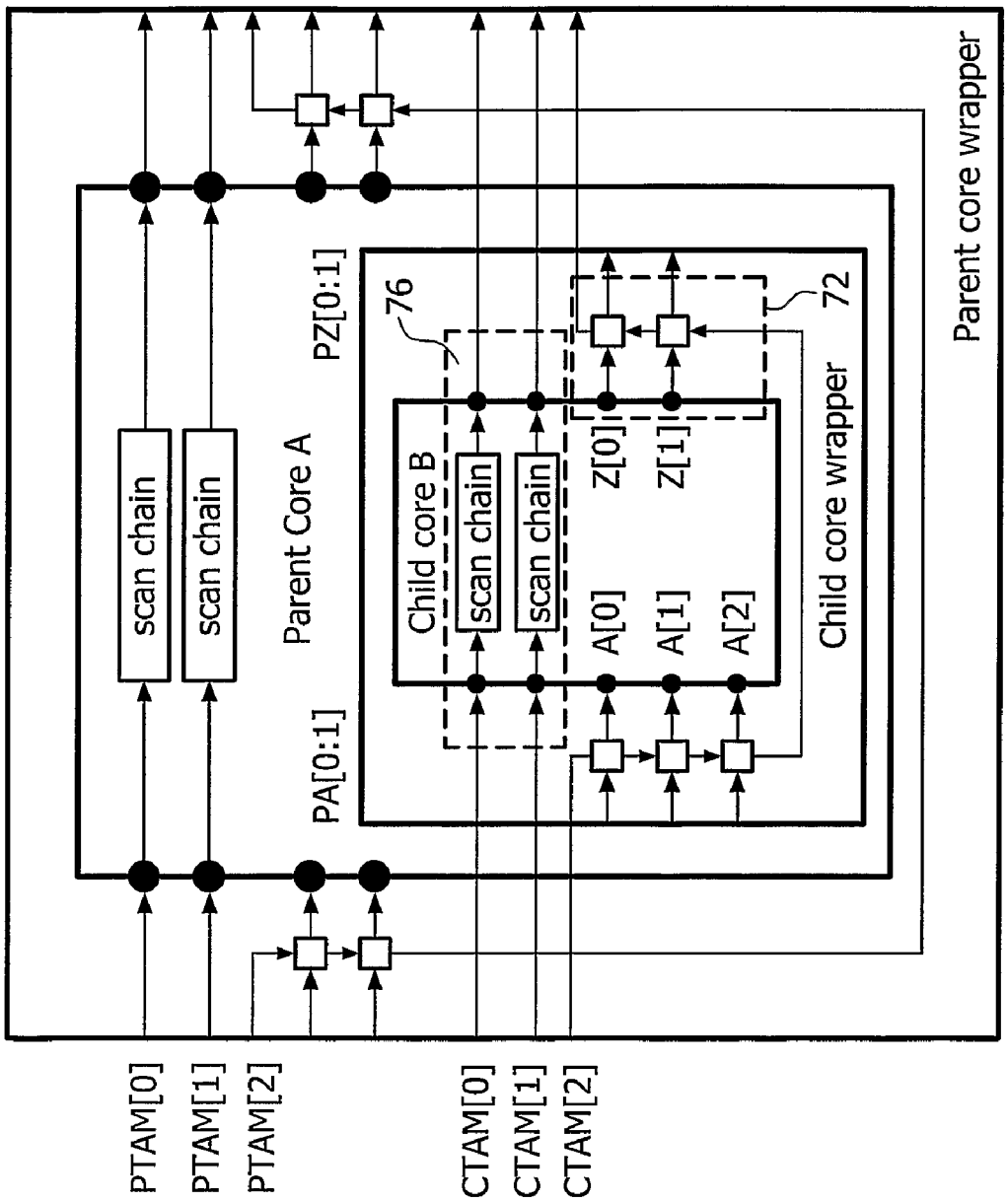
FIG. 10 shows the testing of the child core of FIG. 6, and how test responses are observed.

Referring to FIG. 9, in order to test the child core B in the In-test mode, test stimuli need to be applied to the scan chains 76 of the child core B, and to its wrapper input cells 75 (marked as A[0:2]) only. In addition, as shown in FIG. 10, test responses need to be observed from the scan chains 76 of the child core B and its wrapper output cells 72 (marked as Z[0:1]) only.

Thus, it can be seen from FIGS. 6 to 10 that the testing of the parent core A requires the wrapper of the parent core A to be configured in the In-test mode and the wrapper of the child core B to be configured in the Ex-test mode.

However, testing of the child core B requires the wrapper cells of the child core to be configured in the In-test mode. There is therefore a conflict in that testing of the child core is not possible while the parent core is being tested, since the wrapper architecture only allows a wrapper to be configured in one mode at a time. Furthermore, while testing a parent core, both TAMs, the one connected to the parent core and the other connected the child core are used to transport test data for a parent core. Therefore, the TAM connected to the child core cannot also be used for testing another individual core connected to it.

Therefore, according to the invention, there is provided a wrapper architecture that is adapted to allow a core to be in both In-test and Ex-test modes at the same time, so that the parent and child cores can be tested in parallel. Therefore, with the invention, not only is it possible to obtain optimal test time for flat SOCs but also for hierarchical SOCs.

Figure 11:
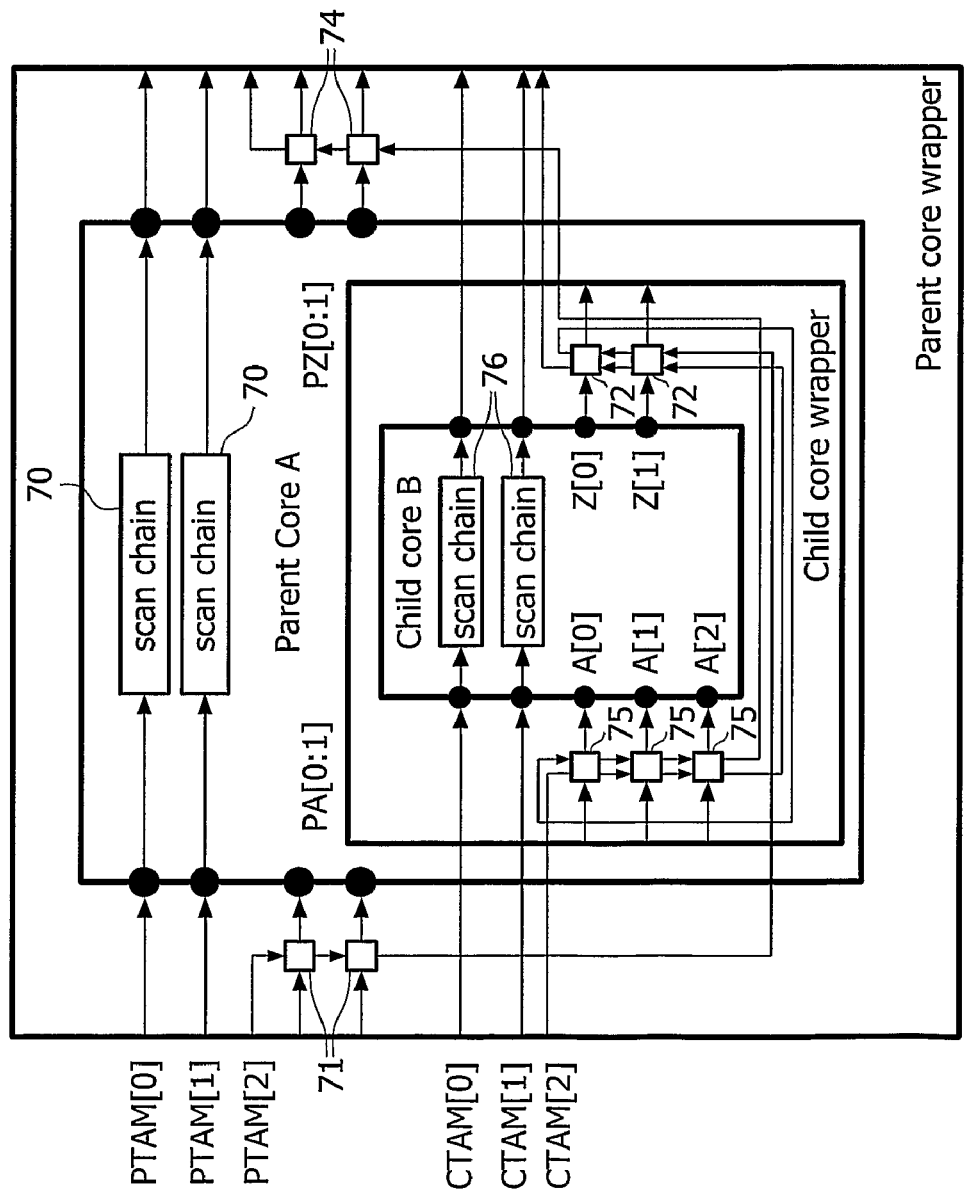
FIG. 11 shows a test architecture for testing hierarchical cores according to the present invention.

FIG. 11 shows a wrapper architecture according to the present invention, having a parent core A and a child core B. As with the conventional wrapper architecture shown in FIG. 6, the parent core comprises scan chains 70, wrapper input cells 71, wrapper output cells 74 and a parent TAM, PTAM [0:2]. Likewise, the child core comprises scan chains 76, wrapper input cells 75 and wrapper output cells 72, and is connected to a child TAM, CTAM [0:2]. However, in accordance with the invention, each wrapper input cell 75 and each wrapper output cell 72 of the child core is adapted to be connected to the parent TAM, PTAM, in addition to being connected to the child TAM, CTAM.

Figure 12A:
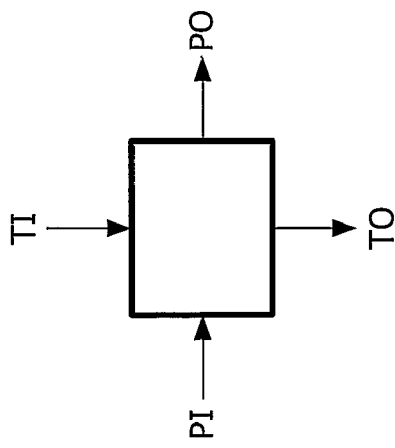
FIG. 12a shows a conceptual view of a conventional wrapper cell.
Figure 12B:
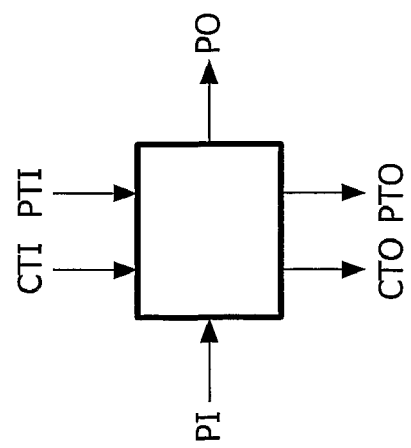
FIG. 12b shows a conceptual view of a wrapper cell according to the present invention.

FIG. 12a shows a conceptual view of the conventional wrapper cell of FIG. 6, while FIG. 12b shows the conceptual view of the wrapper cell 75, 72 of FIG. 11 in accordance with the present invention. In the conventional wrapper cell of FIG. 12a, PI and TI represent the primary and test inputs to the wrapper cell respectively, while PO and TO represent the primary and test outputs from the wrapper cell, respectively. When the wrapper cell of FIG. 12a is used as an input wrapper cell, PI and TI are connected to receive data from the chip and TAM, respectively, while PO and TO output data to the core and "Scan out", respectively. On the other hand, when the wrapper cell of FIG. 12a is used as an output wrapper cell, PI and TI are connected to receive data from the core and TAM, respectively, while PO and TO output data to the chip and "Scan out", respectively.

In the wrapper cell of FIG. 12b, however, CTI and CTO represent test input and output signals corresponding to the child core TAM, while PTI and PTO represent test input and output signals for the parent core TAM.

Figure 13:
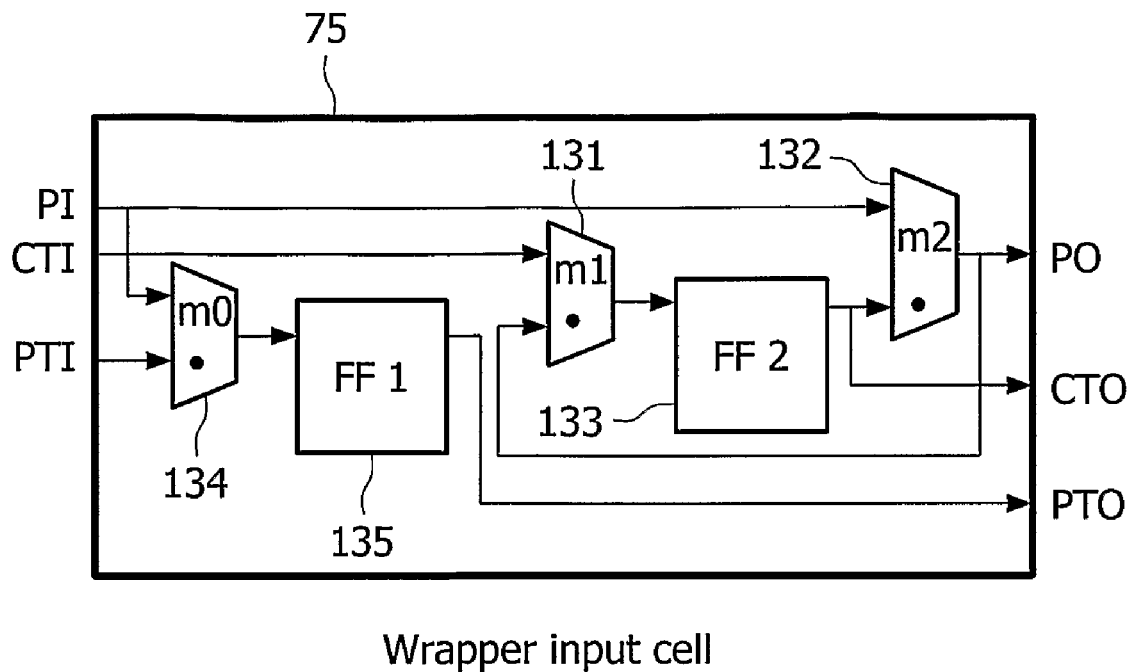
FIG. 13 shows a wrapper input cell according to the present invention.
Figure 14:
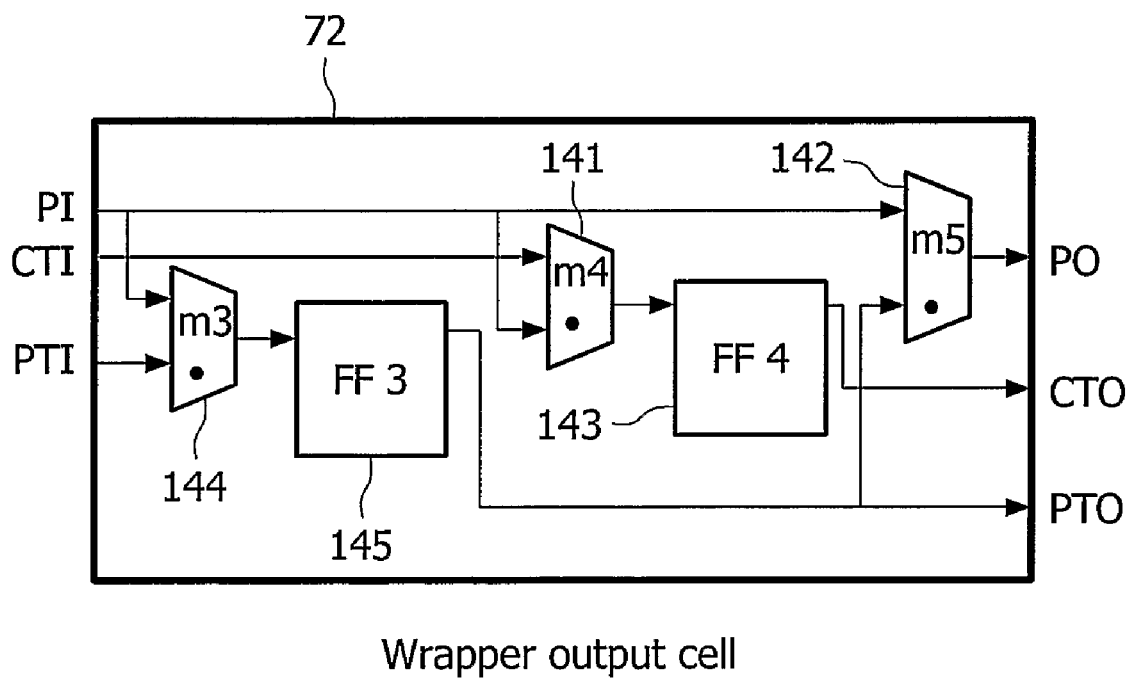
FIG. 14 shows a wrapper output cell according to the present invention.

A more detailed illustration of the wrapper cell 12b is shown in FIGS. 13 and 14. FIG. 13 shows a wrapper input cell 75 according to a preferred embodiment of the present invention. Similar to the conventional wrapper input cell shown in FIG. 5, the wrapper input cell 75 comprises first and second multiplexers 132, 131 and a memory element, such as a flip-flop 133. These elements are configured to receive the primary data and test signals PI and CTI, respectively, and to output the primary data and test signals PO and CTO, respectively. PI and CTI are connected to receive data from the parent core and child TAM, respectively, while PO and CTO are connected to output data to the child core and Scan out for CTAM, respectively. However, the wrapper input cell 75 further comprises a third multiplexer 134 and a second flip-flop 135. The third multiplexer 134 receives the primary input PI and an additional input PTI. PTI is connected to receive data from the TAM of the parent core, PTAM. The output of multiplexer 134 is connected to the flip-flop 135, which in turn provides an additional output signal PTO from the wrapper input cell 75. The additional output signal PTO is connected to the Scan out of the parent TAM, PTAM.

FIG. 14 shows a wrapper output cell 72 according to a preferred embodiment of the present invention. Similar to the conventional wrapper output cell shown in FIG. 5, the wrapper output cell 72 comprises first and second multiplexers 142, 141 and a memory element, such as a flip-flop 143. These elements are configured to receive the primary data and test signals PI and CTI and to output the primary data and test signals PO and CTO. PI and CTI are connected to receive data from the child core and child TAM, respectively, while PO and CTO are connected to output data to the parent core and Scan out for child TAM (CTAM), respectively. However, the wrapper output cell 72 further comprises a third multiplexer 144 and a second flip-flop 145. The third multiplexer 144 receives the primary input PI and an additional input PTI. PTI is connected to receive data from the TAM of the parent core, PTAM. The output of multiplexer 144 is connected to the flip-flop 145, which in turn provides an additional output signal PTO from the wrapper output cell 72. The additional output signal PTO is connected to the Scan out of the parent TAM, PTAM.

The wrapper input and output cells described above allow the child core to be operated in the In-test and Ex-test modes in parallel. Table 2 below shows the multiplexer settings for the various modes supported by the wrapper architecture.

TABLE 2

| Wrapper mode | Wrapper Input Cell | | | Wrapper Output Cell | | |
|---|---|---|---|---|---|---|
| | m0 | m1 | m2 | m3 | m4 | m5 |
| Functional | X | X | 1 | X | X | 1 |
| Child In-test shift | X | 1 | X | X | 1 | X |
| Child In-test normal | X | 0 | 0 | X | 0 | X |
| Parent In-test shift | 0 | X | X | 0 | X | X |
| Parent In-test normal | 1 | X | X | X | X | 0 |

From Table 2, it can be see that the multiplexer settings for both the child core and the parent core in the In-test modes do not conflict with each other. Therefore, with this architecture, the testing of hierarchical cores can be done in parallel.

Figure 15A:
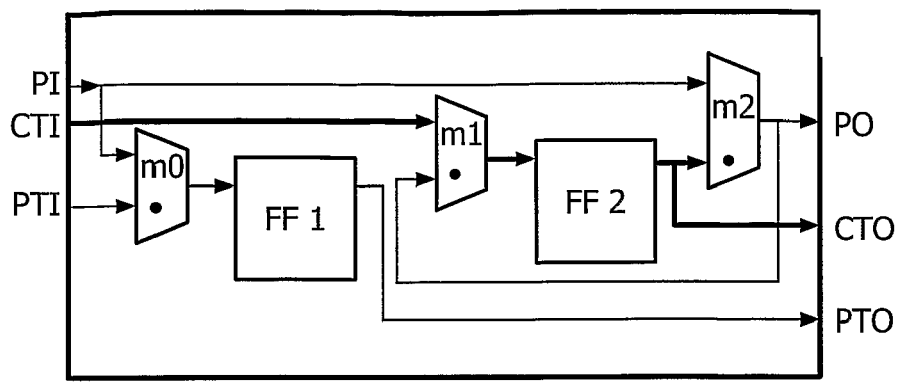
FIGS. 15a to 15d show a wrapper input cell in various modes of operation.

FIGS. 15a to 15d illustrate the functioning of a wrapper input cell 75 in accordance with the settings shown in Table 2. FIG. 15a shows the wrapper input cell 75 when operating in the "In-test shift" mode. As can be seen, the wrapper input cell is configured such that data received from the child core TAM, CTAM, is passed to the Scan out for the child core TAM, CTAM, thus allowing test stimuli to be shifted.

Figure 15B:
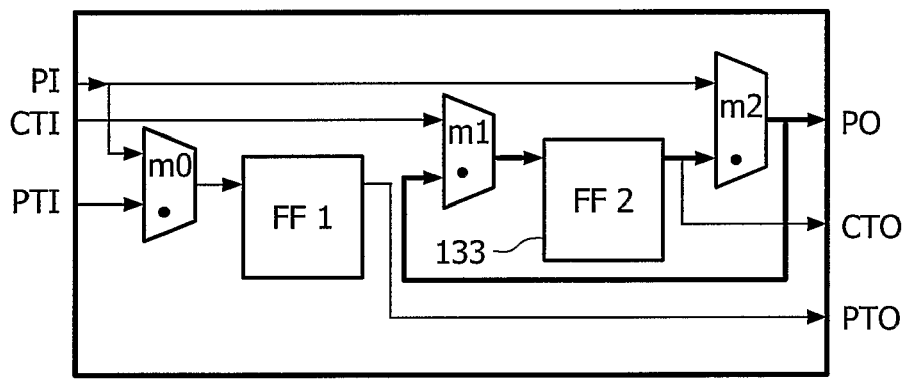

In FIG. 15b, the wrapper input cell 75 is shown in the "In-test normal" mode of operation, in which the child core is being tested. In this mode, the test stimuli stored in the flip-flop 133 following the shift mode is applied to the output PO of the wrapper input cell 72, thereby testing the child core.

Figure 15C:
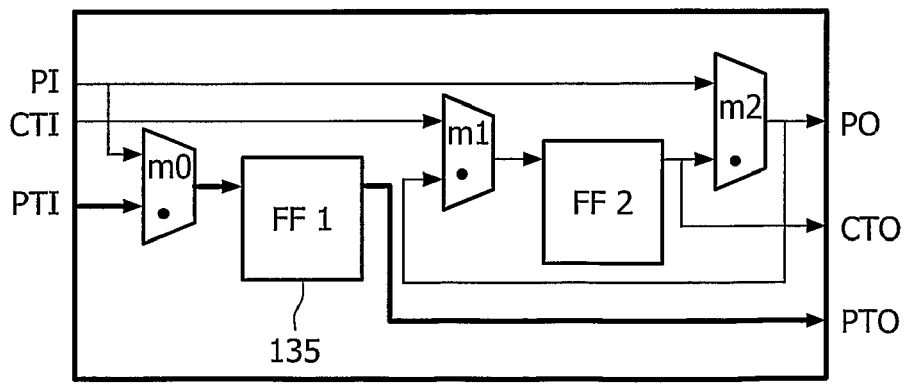

In FIG. 15c, the wrapper input cell 75 is shown in the "Ex-test shift" mode of operation. In this mode, input data PTI received from the parent TAM, PTAM is passed to the Scan out for the parent TAM, PTAM.

Figure 15D:
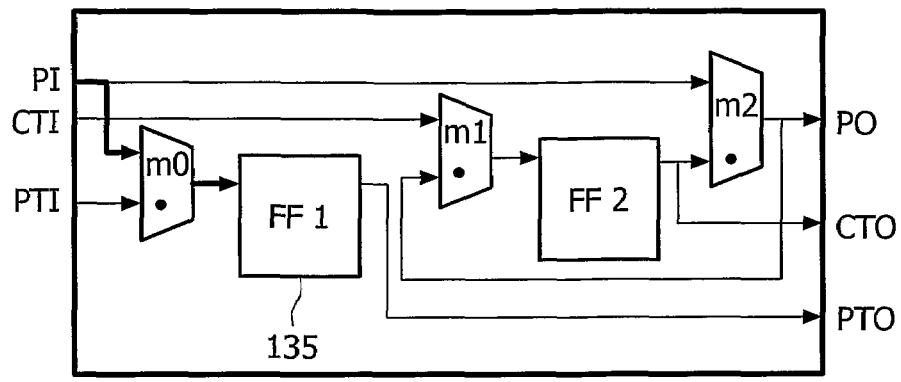

In FIG. 15d, the wrapper input cell 75 is shown in the "Ex-test normal" mode of operation. In this mode, the input data received from the parent core on input PI is stored in the flip-flop 135.

From the above it can be seen that the wrapper input cell 75 according to the present invention can operate in the In-test and Ex-test modes in parallel without conflict, i.e. the modes shown in FIGS. 15b and 15d in parallel, thereby allowing the parent and child cores to be tested in parallel.

Figure 16A:
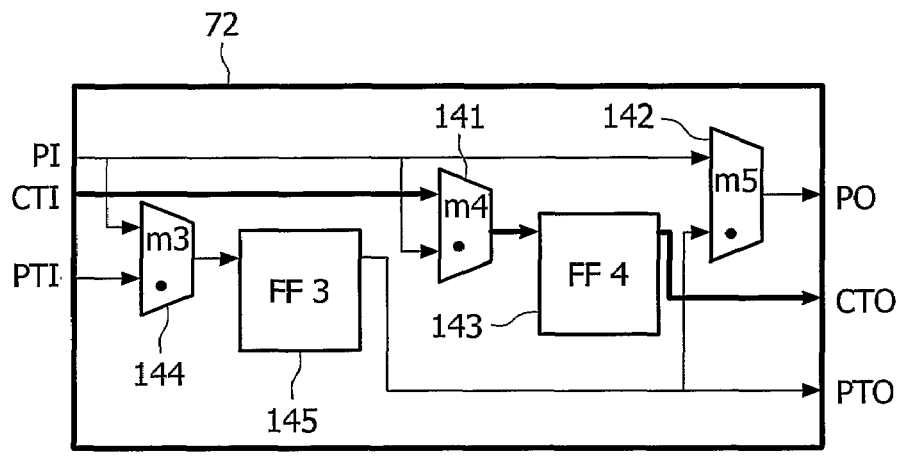
FIGS. 16a to 16d show a wrapper output cell in various modes of operation.

FIGS. 16a to 16d illustrate the functioning of a wrapper output cell 72 in accordance with the settings shown in Table 2. FIG. 16a shows the wrapper output cell 72 when operating in the "In-test shift" mode. As can be seen, the wrapper output cell is configured such that data received from the child TAM on input CTI is passed via the flip-flop 143 to the output CTO which is connected to the Scan out for the child core TAM, thus allowing test stimuli to be shifted.

Figure 16B:
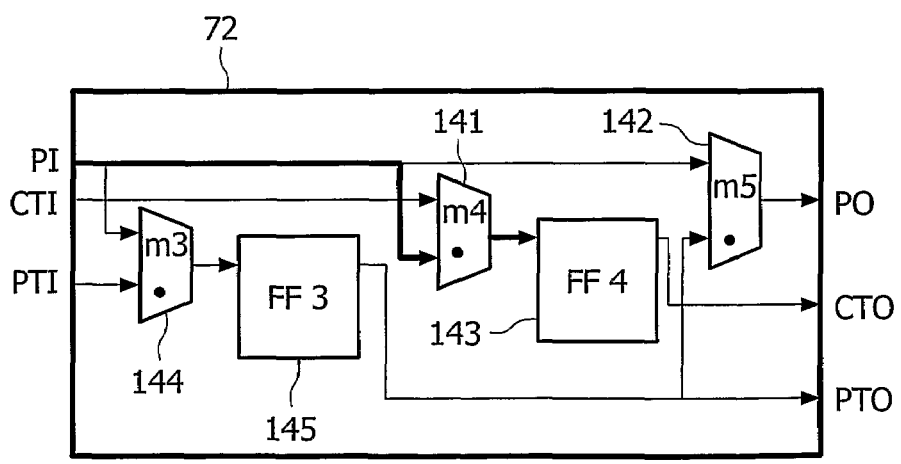

In FIG. 16b, the wrapper output cell 72 is shown in the "In-test normal" mode of operation, in which the child core is being tested. In this mode, the test response data observed from the child core is received on input PI and stored in the flip-flop 143.

Figure 16C:
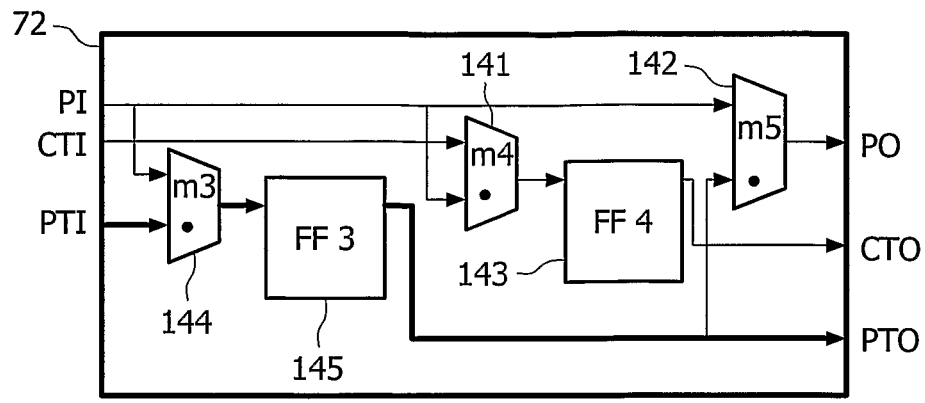

In FIG. 16c, the wrapper output cell 72 is shown in the "Ex-test shift" mode of operation. In this mode, test data received from the parent TAM, PTAM on input PTI is passed via flip-flop 145 to the Scan out for the parent TAM, PTAM.

Figure 16D:
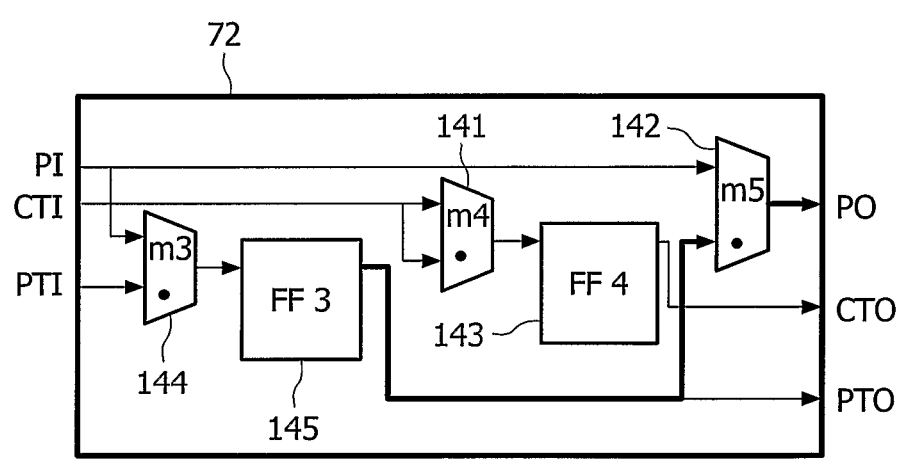

In FIG. 16d, the wrapper output cell 72 is shown in the "Ex-test normal" mode of operation. In this mode, test data previously stored in flip-flop 145 is passed via output PO to the parent core.

From the above it can be seen that the wrapper output cell 72 according to the present invention can operate in the In-test and Ex-test modes in parallel without conflict, i.e. the modes shown in FIGS. 16b and 16d in parallel, thereby allowing the parent and child cores to be tested in parallel.

Figure 17:
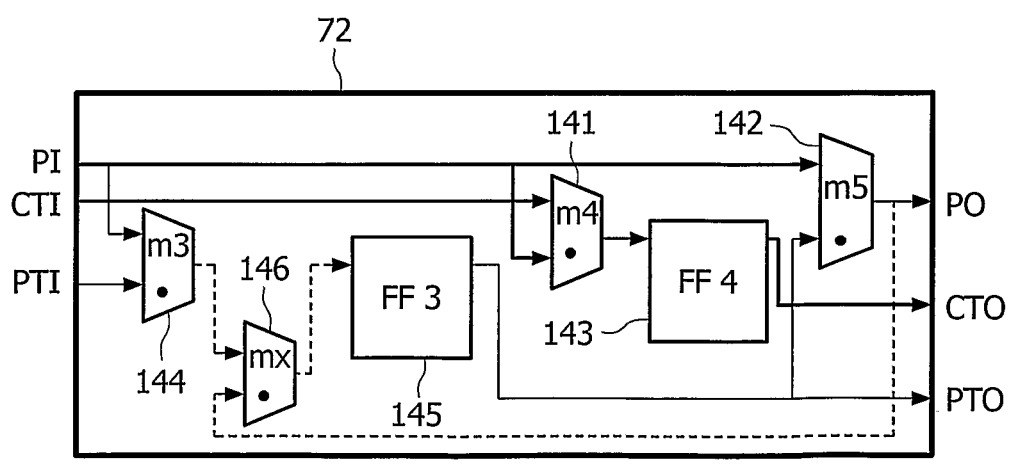
FIG. 17 shows a wrapper output cell according to a further aspect of the invention.

The wrapper input cell described above is fully testable. However, in the wrapper output cell, the output of multiplexer 142 (m5) is not testable. In order to make this multiplexer testable, FIG. 17 show a wrapper output cell according to a further aspect of the invention, in which an additional multiplexer 146 is added to the architecture. The multiplexer 146 can be set to "0" in the parent In-test normal mode, and to "1" for the remainder of the modes. The inclusion of the additional multiplexer 146 in the wrapper output cell 72 means that the multiplexer 142, and hence the entire wrapper output cell 72 is fully testable.

Figure 18A:
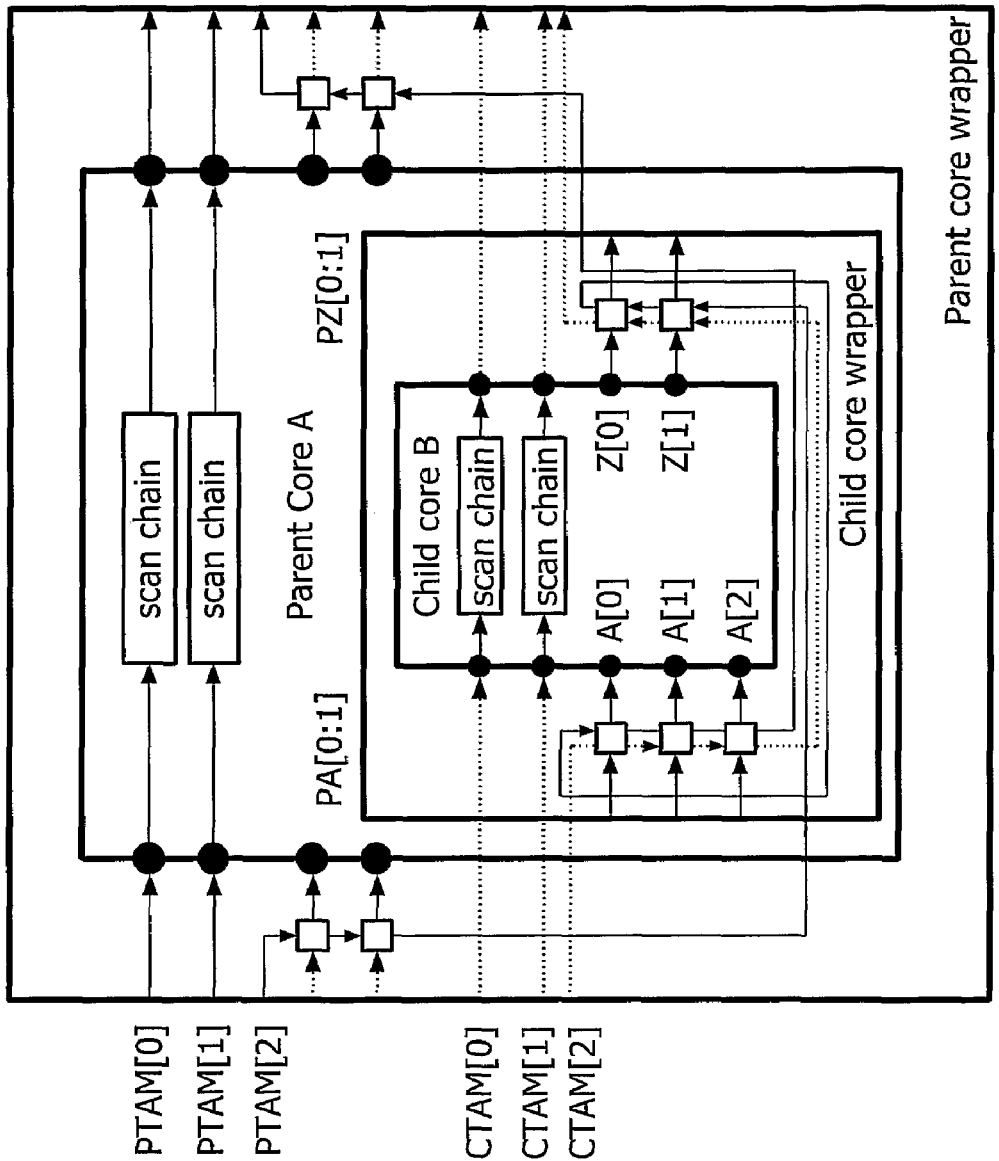
FIGS. 18a and 18b show the wrapper architecture of the present invention in the parent In-test and child In-test modes, respectively.
Figure 18B:
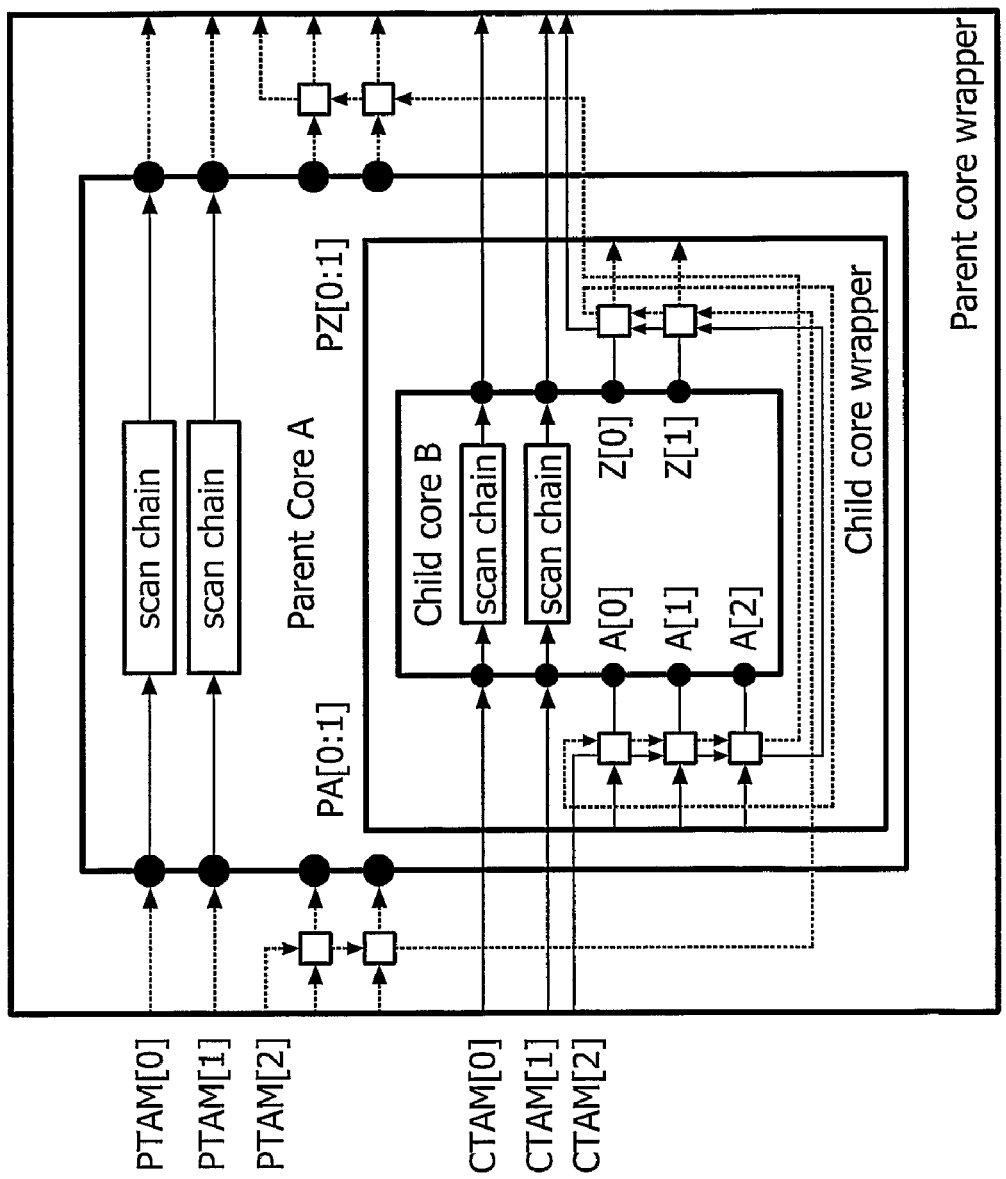

FIGS. 18a and 18b show the wrapper architecture for the hierarchical core using the wrapper cells of the present invention. FIG. 18a shows the parent core in the In-test mode, while FIG. 18b shows the child core in the In-test mode. As can be seen from these Figures, both modes can co-exist in parallel, without being in conflict with one another.

Figure 19:
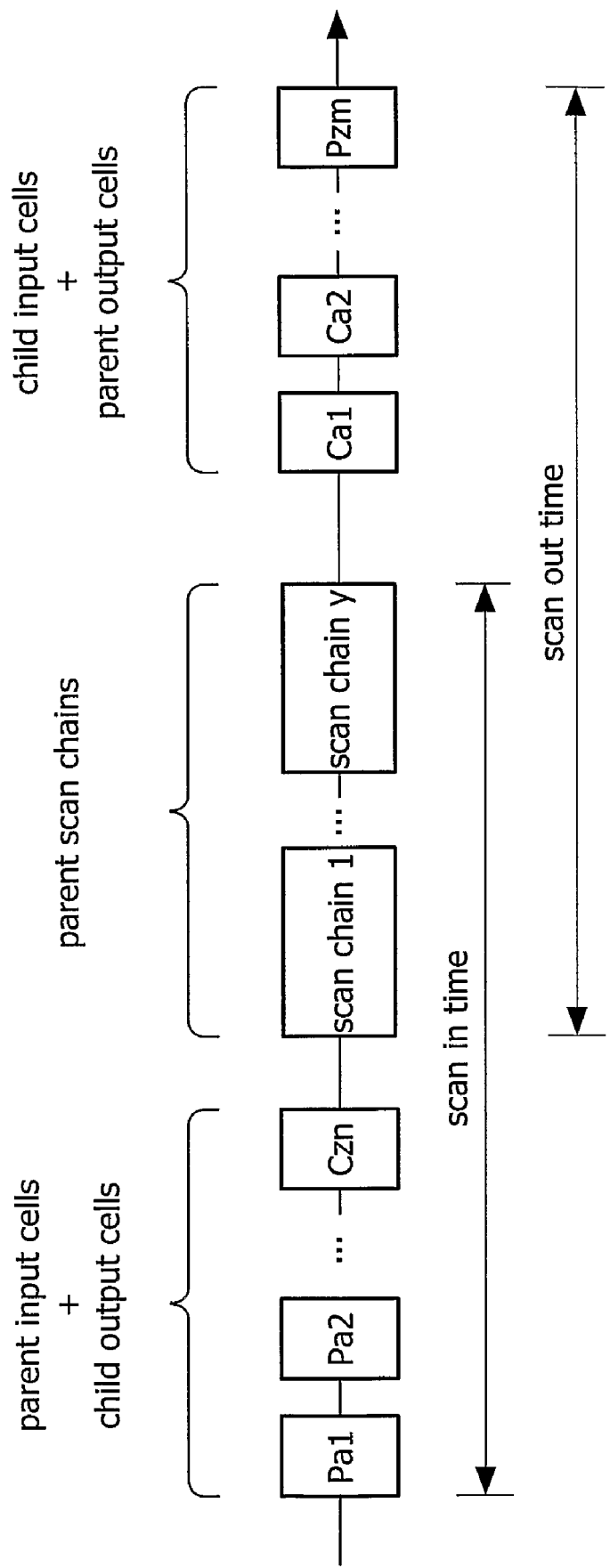
FIG. 19 shows the preferred ordering of various elements in a TAM connected to the parent core.

To minimize the test time for the parent core, FIG. 19 shows the preferred ordering for the wrapper cells and the scan chains in the TAM connected to the parent core. As discussed above, in order to test the parent core, test stimuli need to be applied to the scan chains of the parent core. Similarly, test responses need to be observed from the scan chains and wrapper output cells of the parent core, and also from the wrapper input cells of its child core.

As the scan chains take part in both applying and observing of test data, they should preferably be in the middle of a TAM. The wrapper input cells for the parent core together with the wrapper output cells for the child core should be in front of a TAM. Likewise, the wrapper output cells for the parent core and the wrapper input cells for the child core should be in the end of a TAM.

The invention described above provides an improved test architecture, since it enables the parent and child cores of a hierarchical core to be tested in parallel, thereby minimizing the test schedule.

It will be appreciated by a person skilled in the art that many of the features mentioned in the preferred embodiment can be modified without departing from the scope of the invention as defined in the claims. For example, the number of scan chains, the TAM widths, the number of input/output cells can all vary depending upon a particular application, and the invention is thereby not limited to the specific example described in the preferred embodiment.

In addition, although the preferred embodiment discloses the use of multiplexers and flip-flops in the wrapper cells, other switching and memory devices providing the same function could also be used in accordance with the invention.

Furthermore, although the wrapper architectures have been shown as having parallel ports, it is noted that the wrapper architectures may comprise control circuitry and connections through a one-bit serial port in addition, or as an alternative, to the parallel ports.

It should be noted that the above-mentioned embodiments illustrate rather than limit the invention, and that those skilled in the art will be able to design many alternative embodiments without departing from the scope of the appended claims. The word 'comprising' does not exclude the presence of elements or steps other than those listed in a claim.

The invention claimed is:

1. A test wrapper architecture for testing an electronic circuit having one or more hierarchical cores, the test wrapper architecture comprising:
    a first core having a wrapper input cell and a wrapper output cell, the wrapper input cell and wrapper output cell being configured to receive a primary input signal and a test input signal for the first core, and to output a primary output signal and a test output signal for the first core;
    a second core having a wrapper input cell and a wrapper output cell, the wrapper input cell and wrapper output cell being configured to receive a primary input signal and a test input signal for the second core, and to output a primary output signal and a test output signal for the second core;
    wherein the wrapper input cell and the wrapper output cell of the second core are further adapted to receive a test input signal from the first core, and to output a test output signal to the first core, thereby enabling the first core and the second core to be tested in parallel.

2. A test wrapper architecture as claimed in claim 1, wherein the wrapper input cell and wrapper output cell of the second core are adapted to operate in a In-test mode and an Ex-test mode in parallel.

3. A test wrapper architecture as claimed in claim 2, wherein the wrapper input cell and wrapper output cell of the second core are adapted to apply and capture data in parallel.

4. A test wrapper architecture as claimed in claim 2, wherein the wrapper input cell of the second core is adapted to connect the test input signal of the second core to the test output signal of the second core in a first mode of operation.

5. A test wrapper architecture as claimed in claim 4, wherein the first mode of operation corresponds to a In-test shift mode, during which test data is being shifted through the wrapper input cell via a first memory means.

6. A test wrapper architecture as claimed in claim 5, wherein the wrapper input cell is adapted to connect the data stored in the first memory means to the primary output signal in a second mode of operation.

7. A test wrapper architecture as claimed in claim 6, wherein the second mode of operation corresponds to a In-test normal mode, during which the test data stored in the first memory means during a previous shift operation is connected to the primary output of the wrapper input cell.

8. A test wrapper architecture as claimed in claim 5, wherein one or more of the memory means is a flip-flop.

9. A test wrapper architecture as claimed in claim 2, wherein the wrapper input cell of the second core is adapted to connect the test input signal of the first core to the test output signal of the first core in a third mode of operation, via a second memory means.

10. A test wrapper architecture as claimed in claim 9, wherein the third mode of operation corresponds to a Ex-test shift mode, during which test data is shifted between the test input and the test output via the second memory means.

11. A test wrapper architecture as claimed in claim 2, wherein the wrapper input cell of the second core is adapted to connect the primary input signal of the second core to the second memory means in a fourth mode of operation.

12. A test wrapper architecture as claimed in claim 11, wherein the fourth mode of operation corresponds to a Ex-test normal mode, during which test response data received from the primary input of the first core is stored in the secondary memory means.

13. A test wrapper architecture as claimed in claim 2, wherein the wrapper output cell of the second core is adapted to connect the test input signal of the second core to the test output signal of the second core in a first mode of operation.

14. A test wrapper architecture as claimed in claim 13, wherein the first mode of operation corresponds to a In-test shift mode, during which test data is being shifted through the wrapper output cell via a third memory means.

15. A test wrapper architecture as claimed in claim 2, wherein the wrapper output cell of the second core is adapted to connect the primary input signal to the third memory means in a second mode of operation.

16. A test wrapper architecture as claimed in claim 15, wherein the second mode of operation corresponds to a In-test normal mode, during which the test response data observed from the second core is stored in the third memory means.

17. A test wrapper architecture as claimed in claim 2, wherein the wrapper output cell of the second core is adapted to connect the test input signal of the first core to the test output signal of the first core in a third mode of operation, via a fourth memory means.

18. A test wrapper architecture as claimed in claim 17, wherein the third mode of operation corresponds to a Ex-test shift mode, during which test data is shifted between the test input and the test output via the fourth memory means.

19. A test wrapper architecture as claimed in claim 2, wherein the wrapper output cell of the second core is adapted to connect test data stored in the fourth memory means to the primary output for the first core in a fourth mode of operation.

20. A test wrapper architecture as claimed in claim 19, wherein the fourth mode of operation corresponds to a Ex-test normal mode, during which test data stored in the fourth memory is connected to the primary output for the first core.

21. A test wrapper architecture as claimed in claim 1, wherein the first core is a parent core and the second core is a child core in the hierarchy.

22. An integrated circuit comprising a test wrapper architecture as claimed in claim 1.

23. An automatic test equipment comprising means for operating a test wrapper architecture as defined in claim 1.

24. A wrapper cell for a test architecture used for testing an electronic circuit having one or more hierarchical cores, the wrapper cell comprising:
    a first input for receiving a primary data signal;
    a second input for receiving a test data signal;

a first output for outputting a primary data signal;

a second output for outputting a test data signal;

wherein the wrapper cell further comprises a third input for receiving a test input signal from another core, and a third output for outputting a test output signal to the other core.

25. A wrapper cell as claimed in claim 24, wherein the wrapper cell is an input wrapper cell comprising:

a first multiplexer, the first multiplexer having a first input connected to the first input signal, a second input connected to an output of a first memory means and to the second output of the wrapper cell, and having an output connected to the first output of the wrapper cell;

a second multiplexer, the second multiplexer having a first input connected to the second input of the wrapper cell, a second input connected to the first output of the wrapper cell, and having an output connected to the input of the first memory means; and a third multiplexer, the third multiplexer having a first input connected to the first input of the wrapper cell, a second input connected to the third input of the wrapper cell, and an output connected to the third output of the wrapper cell via a second memory means.

26. A wrapper input cell as claimed in claim 25, wherein in a first mode of operation (In-test shift) the wrapper input cell is adapted to connect the second input to the second output, via the first memory means.

27. A wrapper input cell as claimed in claim 25, wherein in a second mode of operation (In-test normal), the wrapper input cell is adapted to output data stored in the first memory means to the first output.

28. A wrapper input cell as claimed in claim 25, wherein in a third mode of operation (Ex-test shift), the wrapper input cell is adapted to connect the third input to the third output via the second memory means.

29. A wrapper input cell as claimed in claim 25, wherein in a fourth mode of operation (Ex-test normal), the wrapper input cell is adapted to connect the first input to the second memory means.

30. A wrapper cell as claimed in claim 24, wherein the wrapper cell is an output wrapper cell comprising:

a first multiplexer, the first multiplexer having a first input connected to the first input signal, a second input connected to an output of a first memory means and to the third output of the wrapper output cell, and having an output connected to the first output of the wrapper output cell;

a second multiplexer, the second multiplexer having a first input connected to the second input of the wrapper output cell, a second input connected to the first input of the wrapper output cell, and having an output connected to the input of a second memory means; and a third multiplexer, the third multiplexer having a first input connected to the first input of the wrapper output cell, a second input connected to the third input of the wrapper output cell, and an output connected to the third output of the wrapper output cell via the first memory means.

31. A wrapper output cell as claimed in claim 30, wherein in a first mode of operation (In-test shift) the wrapper output cell is adapted to connect the second input to the second output, via the second memory means.

32. A wrapper output cell as claimed in claim 30, wherein in a second mode of operation (In-test normal), the wrapper output cell is adapted to connect the first input to the second memory means.

33. A wrapper output cell as claimed in claim 30, wherein in a third mode of operation (Ex-test shift), the wrapper output cell is adapted to connect the third input to the third output via the first memory means.

34. A wrapper output cell as claimed in claim 30, wherein in a fourth mode of operation (Ex-test normal), the wrapper output cell is adapted to connect test data stored in the first memory means to the first output.

35. A wrapper output cell as claims in claim 30, further comprising a fourth multiplexer having a first input connected to receive the output of the third multiplexer and a second input connected to receive the output of the first multiplexer, the output of the fourth multiplexer providing the input to the first memory means.

36. A wrapper output cell as claimed in claim 35, wherein the wrapper output cell is adapted to test the third multiplexer.

37. An integrated circuit comprising a wrapper cell as claimed in claim 24.

38. An automatic test equipment comprising means for operating a wrapper cell as claimed in claim 24.

39. A method of testing an electronic circuit having one or more hierarchical cores, the method comprising the steps of:

in a first core having a wrapper input cell and a wrapper output cell, configuring the wrapper input cell and wrapper output cell to receive a primary input signal and a test input signal for the first core, and to output a primary output signal and a test output signal for the first core;

in a second core having a wrapper input cell and a wrapper output cell, configuring the wrapper input cell and wrapper output cell to receive a primary input signal and a test input signal for the second core, and to output a primary output signal and a test output signal for the second core; and configuring the wrapper input cell and the wrapper output cell of the second core to receive a test input signal from the first core, and to output a test output signal to the first core, thereby enabling the first core and the second core to be tested in parallel.

* * * * *